US010054731B2

(12) United States Patent
Jung et al.

(10) Patent No.: US 10,054,731 B2
(45) Date of Patent: Aug. 21, 2018

(54) LIGHT SOURCE MODULE AND BACKLIGHT UNIT HAVING THE SAME

(71) Applicant: Seoul Semiconductor Co., Ltd., Ansan-si (KR)

(72) Inventors: Seoung Ho Jung, Ansan-si (KR); Jung Hwa Jung, Ansan-si (KR); Ki Bum Nam, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 54 days.

(21) Appl. No.: 15/146,263

(22) Filed: May 4, 2016

(65) Prior Publication Data

US 2016/0252671 A1  Sep. 1, 2016

Related U.S. Application Data

(63) Continuation of application No. 14/317,825, filed on Jun. 27, 2014, now Pat. No. 9,910,203.

(30) Foreign Application Priority Data

Nov. 1, 2013  (KR) .......................... 10-2013-0132340
Feb. 20, 2014  (KR) .......................... 10-2014-0019740

(51) Int. Cl.
*H01L 33/60*  (2010.01)
*F21V 8/00*  (2006.01)
(Continued)

(52) U.S. Cl.
CPC ............... *G02B 6/0031* (2013.01); *F21V 7/10* (2013.01); *F21V 23/005* (2013.01); *H01L 33/50* (2013.01);
(Continued)

(58) Field of Classification Search
CPC .................................................... G02B 6/0031
See application file for complete search history.

(56) References Cited

U.S. PATENT DOCUMENTS 6,627,922 B1  9/2003  Ishinaga
7,293,906 B2  11/2007  Mok et al.
(Continued)

FOREIGN PATENT DOCUMENTS

KR        10-1235460     6/2006
KR     10-2012-0061539  6/2012
(Continued)

OTHER PUBLICATIONS

Final Office Action dated Jun. 16, 2017, in U.S. Appl. No. 14/317,825.
(Continued)

*Primary Examiner* — Anh Mai
*Assistant Examiner* — Zachary J Snyder
(74) *Attorney, Agent, or Firm* — H.C. Park & Associates, PLC

(57) ABSTRACT

A light source module including a circuit board, a first light emitting device mounted on the circuit board by flip-chip bonding or surface mount technology (SMT), a reflective portion disposed on the circuit board and having at least one recess accommodating the first light emitting device, and a bonding member disposed between the circuit board and the reflective portion. The reflective portion has a height greater than a height of the first light emitting device.

18 Claims, 6 Drawing Sheets

(51) Int. Cl.
  *F21V 7/10* (2006.01)
  *F21V 23/00* (2015.01)
  *H01L 33/50* (2010.01)
  *H05K 1/18* (2006.01)
  *G02F 1/1335* (2006.01)
  *H01L 33/40* (2010.01)

(52) U.S. Cl.
  CPC ............. *H01L 33/60* (2013.01); *H05K 1/181* (2013.01); *G02B 6/009* (2013.01); *G02B 6/0026* (2013.01); *G02B 6/0073* (2013.01); *G02F 1/133615* (2013.01); *H01L 33/405* (2013.01); *H01L 2224/16225* (2013.01); *H05K 2201/10106* (2013.01); *H05K 2201/10121* (2013.01); *H05K 2201/10674* (2013.01)

(56) References Cited

U.S. PATENT DOCUMENTS

| | | | |
|---|---|---|---|
| 8,460,973 | B2 | 6/2013 | Ohkubo |
| 2002/0123163 | A1 | 9/2002 | Fujii |
| 2004/0061440 | A1 | 4/2004 | Imai et al. |
| 2004/0169466 | A1 | 9/2004 | Suehiro et al. |
| 2005/0023545 | A1 | 2/2005 | Camras et al. |
| 2005/0110395 | A1* | 5/2005 | Nagata .............. H01L 24/05 313/498 |
| 2005/0167682 | A1 | 8/2005 | Fukasawa |
| 2006/0118805 | A1 | 6/2006 | Camras et al. |
| 2006/0192216 | A1 | 8/2006 | Ono |
| 2008/0002428 | A1 | 1/2008 | Byun et al. |
| 2008/0006840 | A1 | 1/2008 | Camras et al. |
| 2008/0106894 | A1* | 5/2008 | Kim .................. G02F 1/133603 362/231 |
| 2008/0158882 | A1 | 7/2008 | Wang |
| 2008/0179609 | A1 | 7/2008 | Trottier et al. |
| 2008/0266900 | A1 | 10/2008 | Harbers et al. |
| 2008/0315228 | A1 | 12/2008 | Krarnes et al. |
| 2009/0045416 | A1 | 2/2009 | Bierhuizen et al. |
| 2009/0046479 | A1 | 2/2009 | Bierhuizen et al. |
| 2009/0207619 | A1 | 8/2009 | Park |
| 2010/0072488 | A1 | 3/2010 | Bierhuizen et al. |
| 2010/0073597 | A1 | 3/2010 | Bierhuizen et al. |
| 2010/0277950 | A1 | 11/2010 | Shchekin et al. |
| 2011/0012147 | A1 | 1/2011 | Bierhuizen et al. |
| 2011/0018017 | A1 | 1/2011 | Bierhuizen et al. |
| 2011/0149594 | A1 | 6/2011 | Terajima et al. |
| 2011/0222000 | A1 | 9/2011 | Yabe et al. |
| 2011/0292318 | A1 | 12/2011 | Nakamoto et al. |
| 2012/0002437 | A1 | 1/2012 | Yabe et al. |
| 2012/0140519 | A1 | 6/2012 | Sakai |
| 2013/0250612 | A1 | 9/2013 | Kurihara |
| 2013/0258251 | A1 | 10/2013 | Lee et al. |

FOREIGN PATENT DOCUMENTS

| | | |
|---|---|---|
| KR | 10-2012-0137075 | 6/2012 |
| KR | 10-2013-0110600 | 10/2013 |

OTHER PUBLICATIONS

Written Opinion dated Oct. 21 2014, in International Patent Application No. PCT/KR2014/005718.
International Search Report dated Oct. 21, 2014, in International Patent Application No. PCT/KR2014/005718.
Non-Final Office Action dated Oct. 5, 2015, in U.S. Appl. No. 14/317,825.
Final Office Action dated Apr. 6, 2016, in U.S. Appl. No. 14/317,825.
Non-Final Office Action dated Dec. 16, 2016, in U.S. Appl. No. 14/317,825.
The Notice of Allowance dated Nov. 16, 2017, issued in U.S. Appl. No. 14/317,825.

* cited by examiner (a)

(b)

LIGHT SOURCE MODULE AND BACKLIGHT UNIT HAVING THE SAME

CROSS-REFERENCE TO RELATED APPLICATIONS

This application is a continuation of U.S. patent application Ser. No. 14/317,825, filed on Jun. 27, 2014, and claims priority from Korean Patent Application Nos. 10-2013-0132340, filed on Nov. 1, 2013, and 10-2014-0019740, filed on Feb. 20, 2014, which are all hereby incorporated by reference for all purposes as if fully set forth herein.

BACKGROUND

Field

Exemplary embodiments of the present invention relate to a light source module, and more particularly, to a light source module having a low profile structure while improving an external appearance and luminous efficacy, and a backlight unit including the same.

Background

Generally backlight units are widely used for liquid crystal displays or surface lighting.

Backlight units of liquid crystal displays can be classified into direct type and edge type backlight units according to the locations of the light emitting devices.

The direct type backlight units have been mainly developed along with production of large-size liquid crystal displays having a size of 20 inches or more, and include a plurality of light sources under a diffusive plate to directly emit light towards a front side of a liquid crystal display panel. The direct type backlight units are mainly used in large-screen liquid crystal displays requiring high brightness due to their higher light use efficiency as compared to edge type backlight units.

The edge type backlight units are mainly applied to relatively small liquid crystal displays such as monitors of laptop computers and desktop computers. Such edge type backlight units have good uniformity of light illumination and a long lifespan, and advantageously permit thickness reduction of a liquid crystal display.

An edge type backlight unit structure recently proposed in the art includes a light emitting diode package that advantageously achieves low power consumption and has a low profile structure. The light emitting diode package is mounted on a substrate and disposed inside a backlight unit.

However, an edge type backlight unit including a light emitting diode package has a limit in achieving a low profile structure of the backlight unit. This is due to increased demand for further thickness reduction that makes it difficult to use highly efficient light emitting diode chips due to poor heat dissipation of the light emitting diode package.

The above information disclosed in this Background section is only for enhancement of understanding of the background of the invention and therefore it may contain information that does not form any part of the prior art nor what the prior art may suggest to a person of ordinary skill in the art.

SUMMARY

Exemplary embodiments of the present invention provide a light source module which is advantageous in achieving high efficiency and having a slim structure. In addition, exemplary embodiments of the present invention provide a light source module having a novel structure allowing application of a highly efficient light emitting device while achieving a slim structure.

Exemplary embodiments of the present invention further provide a technology capable of achieving a slim structure of a backlight unit while enhancing external appearance by reducing a non-display area.

Additional features of the invention will be set forth in the description which follows, and in part will be apparent from the description, or may be learned by practice of the invention An exemplary embodiment of the present invention discloses a light source module including a circuit board, a first light emitting device mounted on the circuit board by flip-chip bonding or surface mount technology (SMT), a reflective portion disposed on the circuit board and having at least one recess accommodating the first light emitting device, and a bonding member disposed between the circuit board and the reflective portion. The reflective portion has a height greater than a height of the first light emitting device.

An exemplary embodiment of the present invention also discloses a backlight unit including a light guide plate and a light source module disposed on at least one side of the light guide plate. The light source module including a circuit board, a first light emitting device mounted on the circuit board by flip-chip bonding or surface mount technology (SMT), a reflective portion disposed on the circuit board and having at least one recess accommodating the first light emitting device, and a bonding member disposed between the circuit board and the reflective portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the present invention and are incorporated in and constitute a part of this specification, illustrate exemplary embodiments of the present invention, and together with the description serve to explain the principles of the present invention.

FIG. 2b is a sectional view of the light emitting device taken along line I-I of FIG. 2a.

DETAILED DESCRIPTION OF THE ILLUSTRATED EMBODIMENTS

Figure 1:
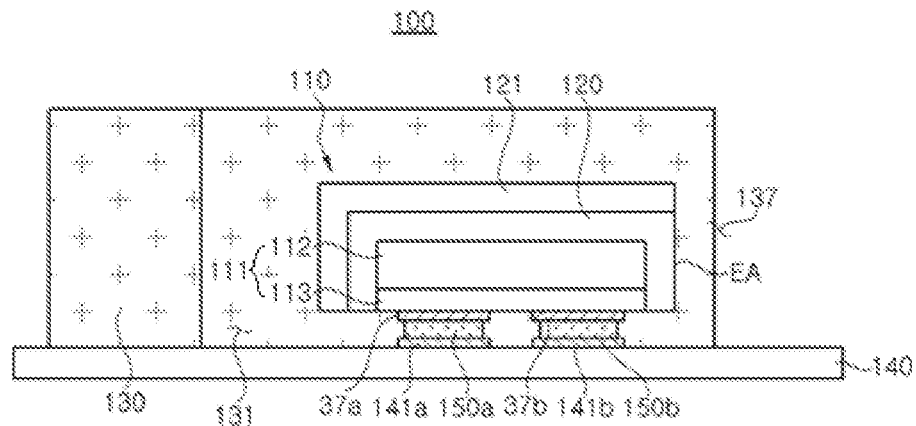
FIG. 1 is a sectional view of a light source module according to an aspect of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a sectional view of a light source module according to an aspect of the present invention.

Referring to FIG. 1, the light source module 100 includes a light emitting device 110 and a circuit board 140.

The circuit board 140 includes substrate pads 141*a*, 141*b* electrically connected to the light emitting device 110 and bumps 150a, 150b placed on the substrate pads 141a, 141b. The circuit board 140 may be a metal PCB, which is advantageous in heat dissipation, without being limited thereto. The circuit board 140 may be a rectangular-shaped board having a major axis and a minor axis.

The light emitting device 110 includes a light emitting diode chip 111, a wavelength conversion layer 120 covering the light emitting diode chip 111, and a reflective layer 121 covering the wavelength conversion layer 120.

The light emitting diode chip 111 includes a growth substrate 112 and a semiconductor stack 113. The light emitting diode chip 111 may be directly placed on the circuit board 140 by flip-chip bonding or may be electrically connected to the circuit board 140 by surface mount technology (SMT). Here, electrode pads 37a, 37b exposed on a lower surface of the light emitting diode chip 111 are electrically connected to the substrate pads 141a, 141b by the bumps 150a, 150b, respectively. Since the light source module 100 does not employ a wire, there is no need for a molding section for protection of the wire or for the partial removal of the wavelength conversion layer 120 to expose the bonding pads. As such, the present disclosure adopts a flip-chip type light emitting diode chip 111, thereby achieving removal of color deviation or brightness spots while simplifying a process of manufacturing the light source module, as compared with a light source module adopting a light emitting diode chip using bonding wires.

The wavelength conversion layer 120 covers the light emitting diode chip 111. The wavelength conversion layer 120 surrounds upper and side surfaces of the light emitting diode chip 111 and contains phosphors therein. The phosphors can convert wavelengths of light emitted from the light emitting diode chip 111. The wavelength conversion layer 120 is coated onto the light emitting diode chip 111 and may cover the upper and side surfaces of the light emitting diode chip 111 in a predetermined thickness. An area of the wavelength conversion layer 120 covering the upper surface of the light emitting diode chip 111 may have the same thickness or a different thickness than the thickness of an area covering the side surfaces of the light emitting diode chip 111. In addition, an area of the wavelength conversion layer 120 covering light exit faces through which light exits the light emitting diode chip may have a different thickness that those of the areas of the wavelength conversion layer which cover the side surfaces and the upper surface of the light emitting diode chip, excluding the light exit faces thereof.

The reflective layer 121 covers upper and side surfaces of the wavelength conversion layer 120 excluding three adjacent side surfaces of the light emitting diode chip 111, which are defined as the light exit faces EA (only one of which can be seen in the cross-sectional view of FIG. 1). The reflective layer 121 serves to reflect light subjected to wavelength conversion by the wavelength conversion layer 120 towards the light exit faces. That is, the reflective layer 121 guides light to exit through the three adjacent side surfaces of the light source module 100. In the light emitting device 110, the reflective layer 121 is configured to expose the three adjacent side surfaces of the wavelength conversion layer 120 therethrough. However, it should be understood that the present invention is not limited thereto. In other embodiments, the light emitting device 110 may further include a structure through which only one side of the wavelength conversion layer 120 is exposed.

The light source module 100 includes a reflective portion 130 formed on the circuit board 140 and enclosing the light emitting device 110.

The reflective portion 130 has an accommodation recess 131 which accommodates the light emitting device 110, and inner surfaces defined by the accommodation recess 131. The accommodation recess 131 exposes an upper surface of the light emitting device 110 and the accommodation recess is open at one side thereof to provide a light discharge portion 137.

The reflective portion 130 may be directly formed on the circuit board 140 by depositing and curing a molding resin on the circuit board. Alternatively, the reflective portion 130 may be placed on the circuit board 140 via a separate bonding member (not shown). The reflective portion 130 serves to reflect light emitted from the light emitting device 110 towards the light discharge portion 137 and to protect the light emitting device 110. The reflective portion 130 may have a profile, the height of which varies depending upon the design of the light emitting device 110. The reflective portion 130 may have the same or greater height than the light emitting device 110.

As described above, the light source module 100 includes the light emitting diode chip 111 mounted on the circuit board 140 by direct flip-chip bonding or SMT, thereby providing an advantage of realizing high efficiency and small size as compared with general package type light source modules using wires.

In addition, the light source module 100 is advantageous in terms of thickness reduction as compared with the general package type light source modules.

Further, in the light source module 100, the reflective portion 130 is formed to enclose the light emitting device 110 on the circuit board 140, thereby enabling light emitted from the light emitting device to be focused in one direction of the light source module 100.

Figure 2A:
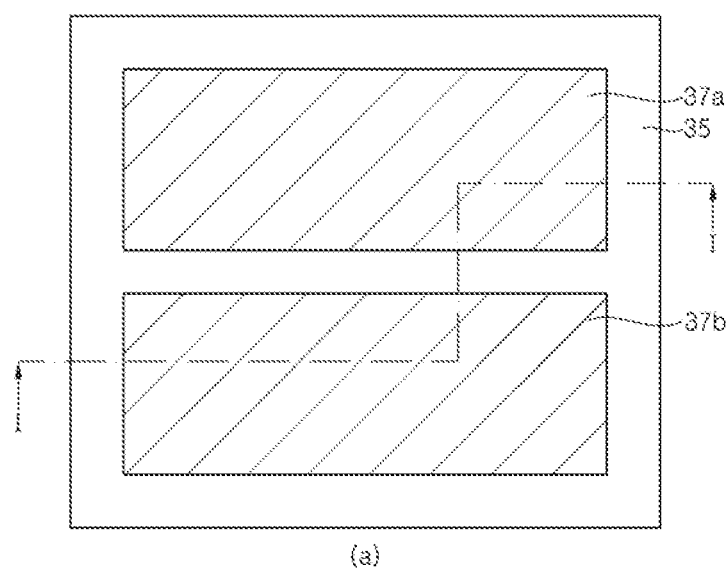
FIG. 2a is a plan view of the light emitting device shown in FIG. 1
Figure 2B:
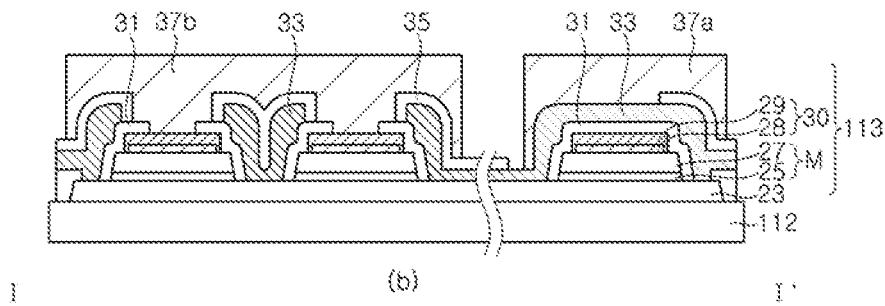

Referring to FIGS. 2a and 2b, the structure of the light emitting diode chip 111 will be described in more detail.

FIG. 2a is a plan view of the light emitting device shown in FIG. 1 and FIG. 2b is a sectional view of the light emitting device taken along line I-I of FIG. 2a.

Referring to FIGS. 2a and 2b, the light emitting diode chip includes the growth substrate 112 and the semiconductor stack 113.

The semiconductor stack 113 includes a first conductive type semiconductor layer 23 formed on the growth substrate 112 and mesas M separated from each other on the first conductive type semiconductor layer 23.

Each of the mesas M includes an active layer 25 and a second conductive type semiconductor layer 27. The active layer 25 is placed between the first conductive type semiconductor layer 23 and the second conductive type semiconductor layer 27. In addition, reflective electrodes 30 are placed on the M, respectively.

As shown, the mesas M may have an elongated shape extending in one direction to be parallel to each other. Such a shape of the mesas can simplify formation of the mesas M having the same shape in chip areas on the growth substrate 112.

The reflective electrodes 30 may be respectively formed on the mesas M after the mesas M are formed, without being limited thereto. Alternatively, after the second conductive type semiconductor layer 27 is grown, the reflective electrodes 30 may be formed on the second conductive type semiconductor layer 27 before the mesas M are formed. The reflective electrode 30 covers an upper surface of the mesa M and has substantially the same shape as the shape of the mesa M in top view.

The reflective electrodes 30 include a reflective layer 28 and may further include a barrier layer 29. The barrier layer 29 may cover an upper surface and side surfaces of the reflective layer 28. For example, a pattern of the reflective layer 28 is formed and the barrier layer 29 is formed thereon, whereby the barrier layer 29 can be formed to cover the upper and side surfaces of the reflective layer 28. For example, the reflective layer 28 may be formed through deposition and patterning of Ag, Ag alloy, Ni/Ag, NiZn/Ag, or TiO/Ag layers. The barrier layer 29 may be formed of Ni, Cr, Ti, Pt, Rd, Ru, W, Mo, TiW or combinations thereof, and prevents diffusion or contamination of metallic materials of the reflective layer.

After the mesas M are formed, an edge of the first conductive type semiconductor layer 23 may also be etched. As a result, an upper surface of the growth substrate 112 can be exposed. The first conductive type semiconductor layer 23 may have an inclined side surface.

According to various embodiments, the light emitting diode chip 111 further includes a lower insulation layer 31 covering the mesas M and the first conductive type semiconductor layer 23. The lower insulation layer 31 has openings formed at predetermined locations thereof, to allow electrical connection to the first conductive type semiconductor layer 23 and the second conductive type semiconductor layer 27 therethrough. For example, the lower insulation layer 31 may have openings through which the first conductive type semiconductor layer 23 is exposed, and openings through which the reflective electrodes 30 are exposed.

The openings may be placed between the mesas M and near the edge of the substrate 112, and may have an elongated shape extending along the mesas M. In addition, the openings are placed only above the mesas M to be biased towards the same ends of the mesas.

The light emitting diode chip 111 includes a current spreading layer 33 formed on the lower insulation layer 31. The current spreading layer 33 covers the plurality of mesas M and the first conductive type semiconductor layer 23. In addition, the current spreading layer 33 is placed within an upper area of each of the mesas (M) and has openings for exposing the reflective electrodes. The current spreading layer 33 may form an ohmic contact with the first conductive type semiconductor layer 23 through the openings of the lower insulation layer 31. The current spreading layer 33 is insulated from the plurality of mesas M and the reflective electrodes 30 by the lower insulation layer 31.

Each of the openings of the current spreading layer 33 has a larger area than the openings of the lower insulation layer 31 to prevent the current spreading layer 33 from being connected to the reflective electrodes 30.

The current spreading layer 33 is formed substantially over the entirety of the upper area of the substrate 112 excluding the openings. This structure allows electric current to easily spread through the current spreading layer 33. The current spreading layer 33 may include a highly reflective metal layer such as an Al layer. The highly reflective metal layer may be formed on a bonding layer such as a Ti, Cr or Ni bonding layer. In addition, a protective layer having a single layer or multilayer structure of Ni, Cr, Au, and the like may be formed on the highly reflective metal layer. The current spreading layer 33 may have, for example, a multi-layer structure of Ti/Al/Ti/Ni/Au.

According to various embodiments, the light emitting diode chip has an upper insulation layer 35 formed on the current spreading layer 33. The upper insulation layer 35 has an opening through which the current spreading layer 33 is exposed and openings through which the reflective electrodes 30 are exposed.

The upper insulation layer 35 may be formed of an oxide insulation layer, a nitride insulation layer, a combination layer or alternating layers of these insulation layers, or may be formed using polymers such as polyimides, Teflon, Parylene, and the like.

A first electrode pad 37a and a second electrode pad 37b are formed on the upper insulation layer 35. The first electrode pad 37a is connected to the current spreading layer 33 through the opening of the upper insulation layer 35, and the second electrode pad 37b is connected to the reflective electrodes 30 through the openings of the upper insulation layer 35. The first and second electrode pads 37a, 37b may be used as pads for connection of bumps or for SMT in order to mount the light emitting diode on the circuit board.

The first and second electrode pads 37a, 37b may be formed together by the same process, for example, by photolithography and etching or by a lift-off process. The first and second electrode pads 37a, 37b may include, for example, a bonding layer such as Ti, Cr or Ni, and a highly conductive metal layer such as Al, Cu, Ag or Au. Each of the first and second electrode pads 37a, 37b may be formed to have both ends thereof placed on the same plane, whereby the light emitting diode chip may be flip-chip bonded to a conductive pattern, which is formed to the same height on the circuit board.

Then, the growth substrate 112 is divided into individual light emitting diode chip units, thereby completing fabrication of light emitting diode chips. The growth substrate 112 may be removed from the light emitting diode chips before or after being divided into the individual light emitting diode chip units.

As described above, the light emitting diode chip 111 mounted on the circuit board by direct flip-chip bonding can realize high efficiency and a small structure, as compared with a general package type light emitting device.

Figure 3:
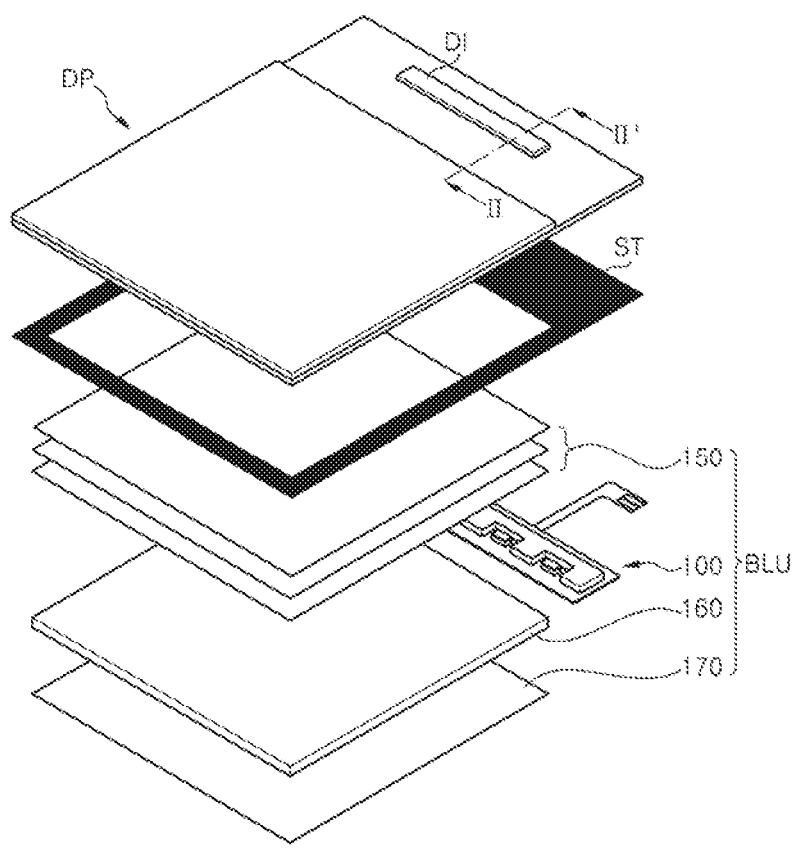
FIG. 3 is an exploded perspective view of a display including a small backlight unit according to an aspect of the present invention.
Figure 4:
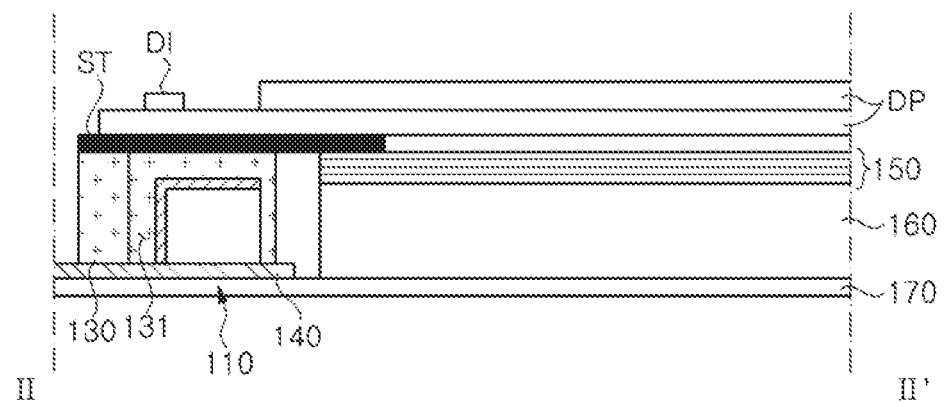
FIG. 4 is a sectional view of the display taken along line II-II' of FIG. 3.
Figure 5:
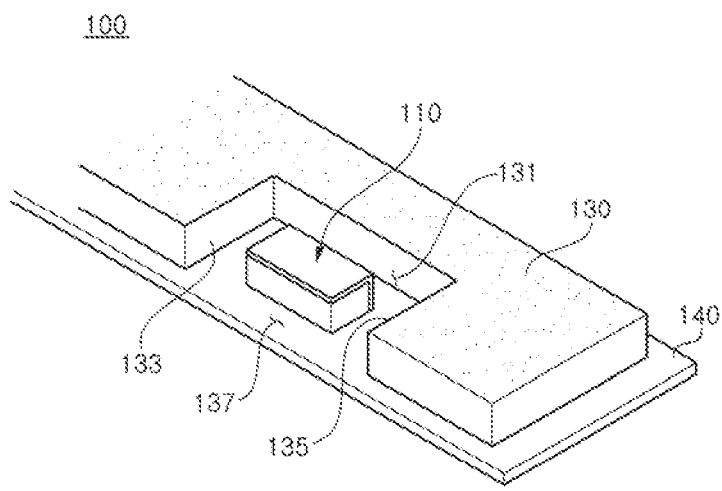
FIG. 5 is a perspective view of a light source module of FIG. 3.

FIG. 3 is an exploded perspective view of a display including a small backlight unit, FIG. 4 is a sectional view of the display taken along line of FIG. 3, and FIG. 5 is a perspective view of a light source module of FIG. 3.

As shown in FIG. 3 to FIG. 5, the display includes a display panel (DP) on which images are displayed, a backlight unit (BLU) disposed at a rear side of the display panel (DP) and emitting light, and a light shielding tape (ST) bonding the display panel (DP) to the backlight unit (BLU) while preventing light leakage at an edge of the display.

The display panel (DP) includes a color filter substrate and a thin film transistor substrate assembled to each other to maintain a uniform cell gap therebetween while facing each other. According to type, the display panel (DP) may further include a liquid crystal layer between the color filter substrate and the thin film transistor substrate. The display panel (DP) may be provided at one side thereof with a drive interface (DI) for driving the panel.

Although not shown in detail in the drawings, the thin film transistor substrate includes a plurality of gate lines and data lines crossing each other to define pixels therebetween, and a thin film transistor placed in each of crossing areas between the gate lines and the data lines to be connected to a pixel electrode disposed in each of the pixels in one-on-one correspondence. The color filter substrate includes RGB color filters corresponding to the respective pixels, a black matrix disposed along the periphery of the substrate and shielding the gate lines, data lines and thin film transistors, and a common electrode covering all of these components. Here, the common electrode may be formed on the thin film transistor substrate.

The backlight unit (BLU) supplying light to the display panel (DP) includes a light guide plate 160 that converts point light into surface light, a light source module 100 disposed on at least one side of the light guide plate 160, optical sheets 150 placed on the light guide plate 160, and a reflective sheet 170 placed under the light guide plate 160.

The light source module 100 includes a circuit board 140, a light emitting device 110, and a reflective portion 130.

The light emitting device 110 is mounted on the circuit board 140 to be separated a constant distance from other light emitting devices. The light emitting device 110 emits light through three side surfaces thereof adjoining the reflective layer 121 (see FIG. 1).

The reflective portion 130 is placed on the circuit board 140 and includes an accommodation recess 131 that accommodates the light emitting device 110 therein. The reflective portion 130 exposes an upper surface of the light emitting device 110 through the accommodation recess 131, which has a light discharge portion 137 open at one side thereof. Here, the light discharge portion 137 corresponds to one open side of the accommodation recess 131 and is defined as a region through which light is discharged outside.

The accommodation recess 131 includes inner surfaces 133, 135, which adjoin the light discharge portion 137 and have a coplanar structure with side surfaces of the light emitting device 110. That is, the inner surfaces 133, 135 are coplanar with the corresponding side surfaces of the light emitting device 110 and serve to reflect light emitted from the side surfaces of the light emitting device 110 towards the light discharge portion 137.

The reflective portion 130 may be directly formed on the circuit board 140 by depositing and curing a molding resin, without being limited thereto. Alternatively, the reflective portion 130 may be placed on the circuit board 140 via a separate bonding member (not shown). The reflective portion 130 may have a profile, the height of which varies depending upon the design of the light emitting device 110. The reflective portion 130 may have the same or greater height than the light emitting device 110.

As such, the present disclosure has an advantageous effect in that light emitted from the light emitting device 110 is reflected towards the light guide plate 160 by the reflective portion 130 formed on the circuit board 140, thereby minimizing light loss while allowing light to be focused in a desired direction.

In addition, the present disclosure can omit a separate structure such as a reflective housing for focusing light on the light guide plate 160 by the structure of the reflective portion 130 integrally formed with the circuit board 140, thereby improving assembly efficiency while advantageously enabling reduction in thickness of the light source module 100 and a slim structure of the backlight unit (BLU) together with the light emitting device 110 that has a decreased thickness.

Figure 6:
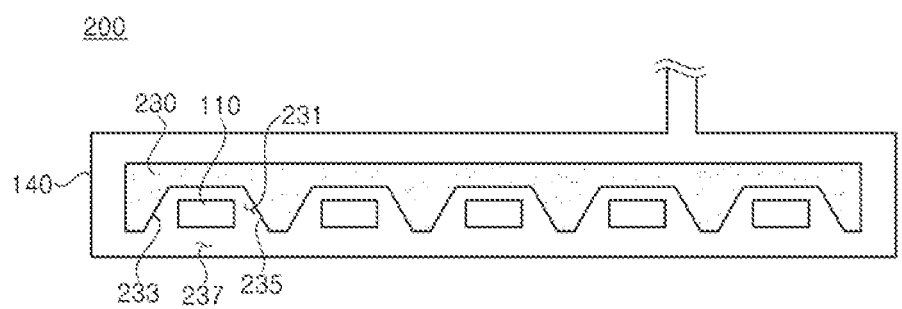
FIG. 6 is a plan view of a light source module according to an aspect of the present invention.
Figure 7:
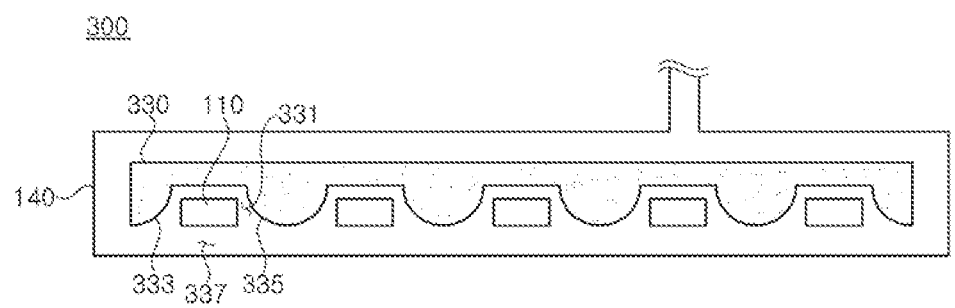
FIG. 7 is a plan view of a light source module according to an aspect of the present invention.

FIG. 6 is a plan view of a light source module 200 according to an aspect of the present invention, and FIG. 7 is a plan view of a light source module according to an aspect of the present invention.

Referring to FIGS. 6 and 7, light source modules 200, 300 have the same structure as that of the light source module 100 except for reflective portions 230, 330. Thus, the similar components will be denoted by the same reference numerals and detailed descriptions thereof will be omitted.

In the light source module 200, the reflective portion 230 is placed on a circuit board 140 and includes an accommodation recess 231 that accommodates a light emitting device 110. The reflective portion 230 exposes an upper surface of the light emitting device 110 through the accommodation recess 231, which has a light discharge portion 237 open at one side thereof. Here, the light discharge portion 237 corresponds to one open side of the accommodation recess 231 and is defined as a region through which light is discharged outside.

The accommodation recess 231 includes inner surfaces 233, 235, which adjoin the light discharge portion 237 and have inclined structures that are symmetrical to each other. That is, the inner surfaces 233, 235 are configured to be gradually apart from each other in a direction of approaching the light discharge portion 237. The inner surfaces 233, 235 serve to reflect light emitted from the side surfaces of the light emitting device 110 towards the light discharge portion 237.

The reflective portion 230 may be directly formed on the circuit board 140 by depositing and curing a molding resin, without being limited thereto. Alternatively, the reflective portion 230 may be placed on the circuit board 140 via a separate bonding member (not shown). The reflective portion 230 may have a profile, the height of which varies depending upon the design of the light emitting device 110. The reflective portion 230 may have the same or greater height than the light emitting device 110.

In the light source module 300, the reflective portion 330 is placed on the circuit board 140 and includes an accommodation recess 331 that accommodates the light emitting device 110. The reflective portion 330 exposes an upper surface of the light emitting device 110 through the accommodation recess 331, which has a light discharge portion 337 open at one side thereof. Here, the light discharge portion 337 corresponds to one open side of the accommodation recess 331 and is defined as a region through which light is discharged outside.

The accommodation recess 331 includes inner surfaces 333, 335, which adjoin the light discharge portion 337 and have curved structures. That is, the inner surfaces 333, 335 are configured to be apart from each other in a direction of approaching the light discharge portion 337. The inner surfaces 333, 335 serve to reflect light emitted from the side surfaces of the light emitting device 110 towards the light discharge portion 337.

The reflective portion 330 may be directly formed on the circuit board 140 by depositing and curing a molding resin, without being limited thereto. Alternatively, the reflective portion 330 may be placed on the circuit board 140 via a separate bonding member (not shown). The reflective portion 330 may have a profile, the height of which varies depending upon the design of the light emitting device 110. The reflective portion 130 may have the same or greater height than the light emitting device 110.

Figure 8:
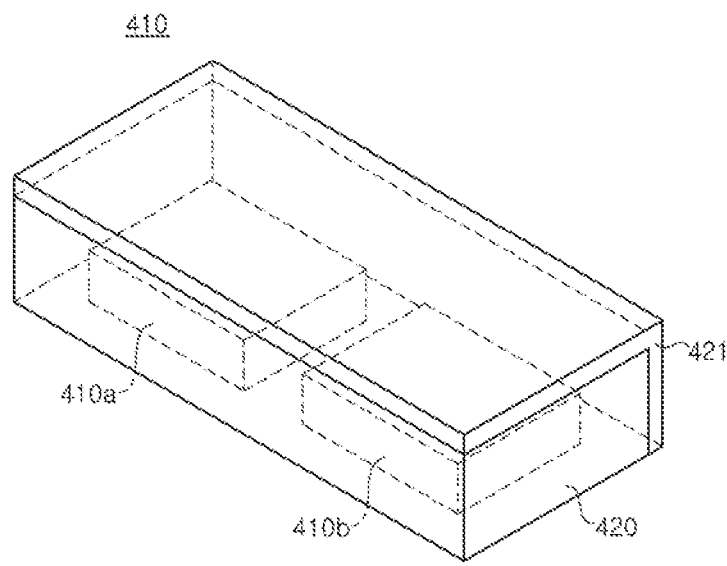
FIG. 8 is a perspective view of a light emitting device according to an aspect of the present invention.
Figure 9:
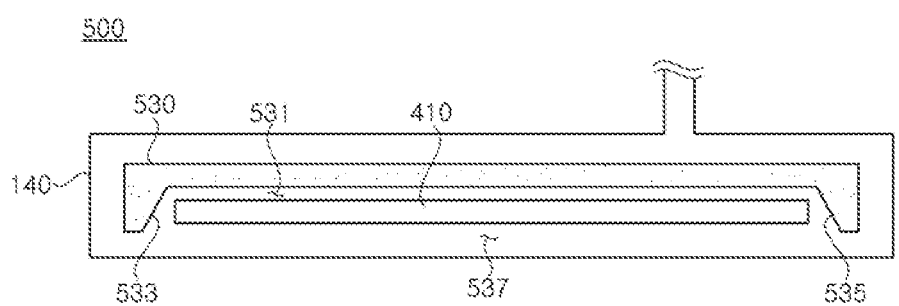
FIG. 9 is a plan view of a light source module including the light emitting device of FIG. 8.

FIG. 8 is a perspective view of a light emitting device 410 according to an aspect of the present invention and FIG. 9 is a plan view of a light source module 500 including the light emitting device of FIG. 8.

Referring to FIGS. 8 and 9, the light source module 500 includes a light emitting device 410, which includes at least two light emitting diode chips 410a, 410b.

A wavelength conversion layer 420 covers the at least two light emitting diode chips 410a, 410b and a reflective layer 421 covers an upper surface and one side surface of the wavelength conversion layer 420.

Herein, the light emitting device 410 is illustrated as including two light emitting diode chips 410a, 410b. However, it should be understood that the present invention is not limited thereto, and the number of light emitting diode chips 410a, 410b may be changed.

In the light source module 500, the light emitting device 410 including the at least two light emitting diode chips 410a, 410b, and a reflective portion 530 are placed on a circuit board 140.

The reflective portion 530 includes an accommodation recess 531 that accommodates the light emitting device 410 therein. The reflective portion 530 exposes an upper surface of the light emitting device 410 through the accommodation recess 531, which has a light discharge portion 537 open at one side thereof. Here, the light discharge portion 537 corresponds to one open side of the accommodation recess 531 and is defined as a region through which light is discharged outside.

The accommodation recess 531 includes inner surfaces 533, 535, which adjoin the light discharge portion 537 and have inclined structures. That is, the inner surfaces 533, 535 are configured to be spaced apart from each other in a direction of approaching the light discharge portion 537. The inner surfaces 533, 535 serve to reflect light emitted from the side surfaces of the light emitting device 410 towards the light discharge portion 537.

The reflective portion 530 may be directly formed on the circuit board 140 by depositing and curing a molding resin, without being limited thereto. Alternatively, the reflective portion 530 may be placed on the circuit board 140 via a separate bonding member (not shown). The reflective portion 530 may have a profile, the height of which varies depending upon the design of the light emitting device 410. The reflective portion 530 may have the same or greater height than the height of the light emitting device 410.

In the light source module 500, the reflective portion 530 is formed to enclose the light emitting device 410 on the circuit board 140, thereby allowing light to be focused towards one side of the light source module 500.

Figure 10:
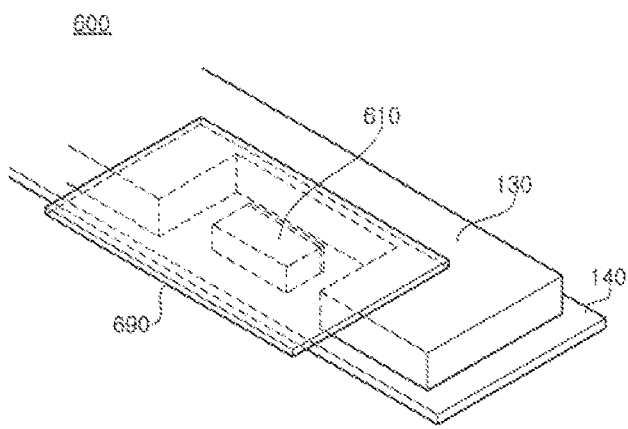
FIG. 10 is a perspective view of a light source module according to an aspect of the present invention.
Figure 11:
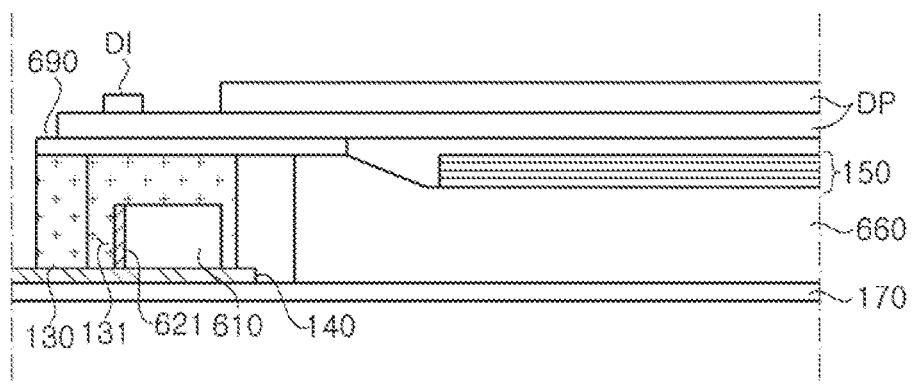
FIG. 11 is a sectional view of a display including the light source module of FIG. 10.

FIG. 10 is a perspective view of a light source module 600 according to an aspect of the present invention and FIG. 11 is a sectional view of a display including the light source module of FIG. 10.

Referring to FIGS. 10 and 11, light source module 600 includes a circuit board 140, a light emitting device 610, a reflection cover 690, and a reflective portion 130.

The light source module 600 according to this aspect has the same structure as that of the light source module 100 (see FIG. 5) except for the light emitting device 610 and the reflection cover 690. Thus, the similar components as those of the first embodiment will be denoted by the same reference numerals and detailed descriptions thereof will be omitted.

At least one light emitting device 610 is mounted on the circuit board 140 to be separated a constant distance from other light emitting devices. The light emitting device 610 emits light through an upper surface and three side surfaces thereof adjoining the reflective layer 621. That is, the reflective layer 621 is placed at one side of the light emitting device 610.

The reflection cover 690 and the reflective portion 130 serve to reflect light emitted from the light emitting device 610. The reflection cover 690 is placed on the reflective portion 130. More specifically, the reflection cover 690 covers the reflective portion 130 which accommodates the light emitting device 610. Namely, the reflection cover 690 can reflect light emitted through the upper surface of the light emitting device 610.

The reflective portion 130 may be directly formed on the circuit board 140 by depositing and curing a molding resin, without being limited thereto. Alternatively, the reflective portion 130 may be placed on the circuit board 140 via a separate bonding member (not shown). The reflective portion 130 may have a profile, the height of which varies depending upon the design of the light emitting device 610. The reflective portion 130 may have the same or greater height than the light emitting device 610.

The display including the light source module 600 includes a display panel (DP) and a backlight unit (BLU).

The backlight unit (BLU) includes a light guide plate 660 which converts point light into surface light, a light source module 600 disposed on at least one side of the light guide plate 660, optical sheets 150 placed on the light guide plate 660, and a reflective sheet 170 placed under the light guide plate 660.

The light guide plate 660 has a structure, one side of which adjacent the light emitting device 610 is thicker than a light exit area thereof. Specifically, the light guide plate 660 has an upper surface of a stepped structure. The stepped structure includes an inclined surface between a light incident area and the light exit area. The stepped structure of the light guide plate 660 is advantageous in providing a slim structure.

The light source module 600 is disposed on at least one side of the light guide plate 660 to be parallel thereto. The light source module 600 has a structure in which the circuit board 140 contacts an upper surface of the reflective sheet 170.

The reflection cover 690 covers the reflective portion 130 and may extend to an upper surface of the light incident area. Although the reflection cover 690 is illustrated as covering the reflective portion 130 while extending to the upper surface of the light incident area, it should be understood that the present invention is not limited thereto and the reflection cover 690 may also extend to the inclined surface of the light guide plate 660.

As such, the present invention has an advantageous effect in that light emitted from the light emitting device 610 is reflected towards the light guide plate 660 by the reflective portion 130 formed on the circuit board 140 and the reflection cover 690 placed on the reflective portion 130, thereby minimizing light loss while allowing light to be focused in a desired direction.

In addition, the present invention can omit components such as a reflective housing and the like by providing a simplified structure, which includes the reflective portion 130 integrally formed on the circuit board 140 and the reflection cover 690 placed on the reflective portion 130, thereby improving assembly efficiency while advantageously enabling reduction in thickness of the light source module and a slim structure of the backlight unit (BLU) together with the light emitting device 610 which has a decreased thickness.

Figure 12:
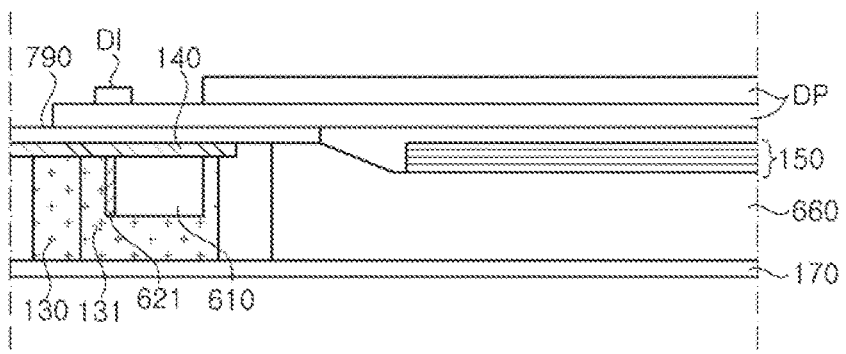
FIG. 12 is a sectional view of a display including a light source module according to an aspect of the present invention.

FIG. 12 is a plan view of a light source module according to an aspect of the present invention.

As shown in FIG. 12, the display has the same configuration as that of the display according to FIG. 11 except for a light source module. Thus, the similar components as those of FIG. 11 will be denoted by the same reference numerals and detailed descriptions thereof will be omitted.

In the light source module, a circuit board 140 is directed towards a display panel (DP) and an upper surface of a reflective portion 130 contacts a reflective sheet 170. The circuit board 140 is provided at one side thereof with the reflective portion 130 and a light emitting device 610, and provided at the other side thereof with a reflection cover 790.

The reflection cover 790 may cover the circuit board 140 while extending to the upper surface of the light incident area of the light guide plate 660. Although the reflection cover 790 is illustrated as covering the circuit board 140 while extending to the upper surface of the light incident area, it should be understood that the present invention is not limited thereto and the reflection cover 790 may also extend to the inclined surface of the light guide plate 660.

As such, the present invention has an advantageous effect in that light emitted from the light emitting device 610 is reflected towards the light guide plate 660 by the reflection cover 790 formed on the circuit board 140, thereby minimizing light loss while allowing light to be focused in a desired direction.

In addition, the present invention can omit components of a typical backlight unit, such as a reflective housing and the like, by providing a simplified structure, which includes the reflective portion 130 integrally formed with one side of the circuit board 140 and the reflection cover 790 placed on the other side of the circuit board 140, thereby improving assembly efficiency while advantageously enabling reduction in thickness of the light source module and a slim structure of the backlight unit (BLU) together with the light emitting device 610 which has a decreased thickness.

Figure 13:
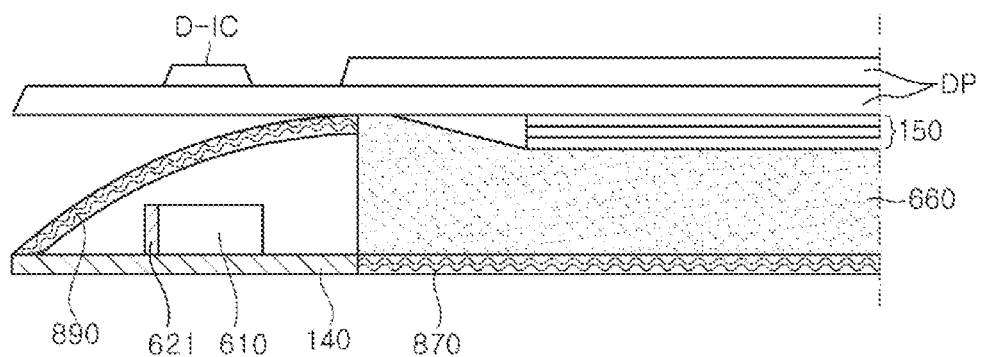
FIG. 13 and FIG. 14 are exploded perspective views of a display including a backlight unit according to an aspect of the present invention.
Figure 14:
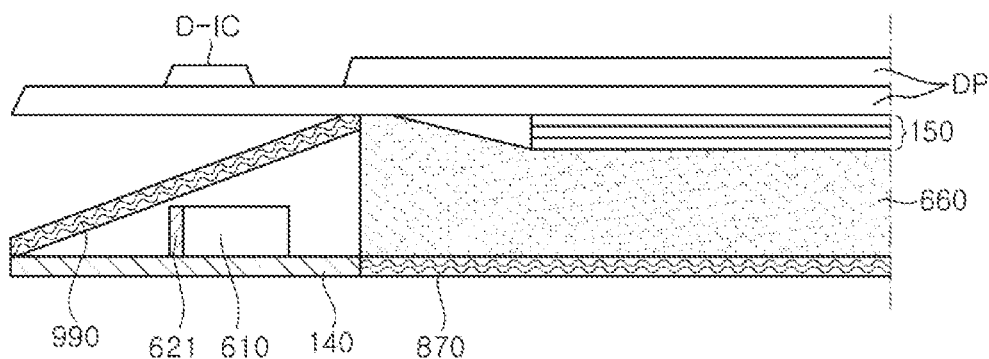

FIG. 13 and FIG. 14 are exploded perspective views of a display including a backlight unit according to an aspect of the present invention.

Referring to FIGS. 13 and 14, the display devices include the same components as FIG. 11 except for a reflector 890, 990 and a reflective sheet 870. Thus, the similar components will be denoted by the same reference numerals, and detailed descriptions thereof will be omitted except for the reflector 890, 990.

One side surface of the light emitting device 610 faces a light in a light incident face of the light guide plate 660. Here, the light incident face may be defined as one side surface of the light guide plate 660, through which light emitted from the light emitting device 610 enters the light guide plate 660.

The reflector 890, 990 is disposed on the light emitting device 610 and the circuit board 140. The reflector 890, 990 comprises a curved structure or in an inclined structure. The reflector 890, 990 includes one side surface to contact a portion of the upper surface of the circuit board 140 and the other side surface to contact a portion of the side surface of light guide plate 660. That is, the first reflector may have the one side surface facing the portion of the upper surface of the circuit board 140, the other side surface facing the portion of the side surface of light guide plate 660. The reflector 890, 990 may be prepared by coating a reflective material onto a surface of a base layer, or may be formed of a base layer composed of a reflective material. In addition, the reflector 890, 990 may further include an adhesive material formed on the surface of the base layer. The reflective sheet 870 is disposed under the light guide plate 660.

According to various embodiments, light emitted from the light emitting device 610 can be incident on the light guide plate 660 without loss due to the reflector 890, 990 enclosing the portion of the other surface of the circuit board 140 and the one side surface of the light emitting device 610.

Although some exemplary embodiments have been described herein, it should be understood that the present invention is not limited to certain embodiments. In addition, some features of a certain embodiment may also be applied to other embodiments in the same or similar ways without departing from the spirit and scope of the present invention as set forth in the claims.

What is claimed is:

1. A light source module comprising:
   a circuit board;
   a first light emitting device mounted on the circuit board by flip-chip bonding or surface mount technology (SMT);
   a reflective portion disposed on the circuit board and comprising at least one recess accommodating the first light emitting device and an open end forming a light discharge portion; and
   a reflective layer disposed on a top of the first light emitting device and a side of the first light emitting device opposite the light discharge portion, the reflective layer configured to guide emitted light to exit through other side surfaces of the first light emitting device,
   wherein the reflective portion has a height greater than a height of the first light emitting device.

2. The light source module of claim 1, wherein the at least one recess exposes an upper surface of the circuit board.

3. The light source module of claim 1, wherein the at least one recess accommodates at least two light emitting diode chips.

4. The light source module of claim 1, further comprising a second light emitting device mounted on the circuit board in a first direction,
   wherein the reflective portion is disposed on the circuit board such that the first and second light emitting devices are accommodated in the at least one recess in the first direction.

5. The light source module of claim 4, wherein the circuit board has an elongated shape corresponding to the arrangement of the reflective portion.

6. The light source module of claim 1, wherein the first light emitting device comprises a light emitting diode chip, and a wavelength conversion layer covers upper and side surfaces of the light emitting diode chip in uniform thickness.

7. The light source module of claim 1, wherein the at least one recess exposes an upper surface of the first light emitting device.

8. The light source module of claim 4, wherein the light discharge portion extends in a second direction, the second direction being perpendicular to the first direction.

9. The light source module of claim 8, wherein the reflective portion encloses the first light emitting device while exposing the light discharge portion.

10. The light source module of claim 1, wherein the at least one recess comprises inclined inner surfaces.

11. A backlight unit comprising:
    a light guide plate; and
    a light source module disposed on at least one side of the light guide plate,
    wherein the light source module comprises:
    a circuit board;
    at least one light emitting device mounted on the circuit board by flip-chip bonding or surface mount technology (SMT);
    a reflective portion disposed on the circuit board and comprising at least one recess accommodating the light emitting device and an open end forming a light discharge portion; and
    a reflective layer disposed on a top of the first light emitting device and a side of the first light emitting device opposite the light discharge portion, the reflective layer configured to guide emitted light to exit through other side surfaces of the first light emitting device.

12. The backlight unit of claim 11, where the reflective portion has a height greater than a height of the at least one light emitting device.

13. The backlight unit of claim 11, wherein the at least one recess exposes an upper surface of the circuit board.

14. The backlight unit of claim 11, wherein the at least one recess accommodates at least two light emitting diode chips.

15. The backlight unit of claim 11, wherein the at least one light emitting device are mounted on the circuit board in a first direction, and
   wherein the reflective portion is disposed on the circuit board such that the at least one light emitting device is accommodated in the at least one recess in the first direction.

16. The backlight unit of claim 15, wherein the circuit board has an elongated shape corresponding to the arrangement of the reflective portion.

17. The backlight unit of claim 11, wherein the light discharge portion faces the light guide plate, and
   wherein the reflective portion encloses the at least one light emitting device while exposing the light discharge portion.

18. The backlight unit of claim 11, wherein the at least one recess comprises inclined inner surfaces.

* * * * *